(12) United States Patent
Sung et al.

(10) Patent No.: US 7,372,270 B2
(45) Date of Patent: May 13, 2008

(54) COMPENSATING FOR NON-UNIFORMITY OF EXCITATION FIELD IN MRI

(75) Inventors: KyungHyun Sung, Los Angeles, CA (US); Krishna Nayak, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 11/531,090

(22) Filed: Sep. 12, 2006

(65) Prior Publication Data
US 2007/0057673 A1   Mar. 15, 2007

Related U.S. Application Data

(60) Provisional application No. 60/716,745, filed on Sep. 12, 2005.

(51) Int. Cl.
*G01V 3/00* (2006.01)
(52) U.S. Cl. .................. 324/314; 324/318
(58) Field of Classification Search ......... 324/314, 324/318, 322, 306, 307, 309
See application file for complete search history.

(56) References Cited

U.S. PATENT DOCUMENTS

| | | | | |
|---|---|---|---|---|
| 5,217,016 A | * | 6/1993 | Axel et al. ............ | 600/410 |
| 6,268,728 B1 | * | 7/2001 | Morrell ................. | 324/307 |
| 6,900,636 B2 | * | 5/2005 | Leussler .............. | 324/318 |
| 7,053,612 B2 | * | 5/2006 | St. Pierre et al. ...... | 324/307 |
| 7,078,901 B2 | * | 7/2006 | Feiweier et al. ....... | 324/318 |
| 7,218,113 B2 | * | 5/2007 | Feiweier et al. ....... | 324/320 |

OTHER PUBLICATIONS

Pauly, J. et al. A k-Space Analysis of Small-Tip-Angle Excitation. In J. or Magnetic Resonance, vol. 81 (1989), pp. 43-56.
Frederickson, J.O. et al. Flow Effects of Spectral Spatial Excitation. 1997, p. 113. (http://mrel.usc.edu/class/articles/).
Zur, Y. Design of Improved Spectral-Spatial Pulses for Routine Clinical Use. Magnetic Resonance in Medicine, vol. 43 (2000), pp. 410-420.
Deichmann, R. et al. RF Inhomogeneity Compensation in Structural Brain Imaging. Magnetic Resonance in Medicine, vol. 47 (2002), pp. 398-402.

(Continued)

*Primary Examiner*—Louis M. Arana
(74) *Attorney, Agent, or Firm*—McDermott Will & Emery LLP

(57) ABSTRACT

A method and system are described for compensating for non-uniformity of excitation field B1+ in magnetic resonance imaging (MRI) of an object. The variation in the RF excitation field B1+ is measured over a region of interest (ROI) in the object, the B1+ field causing nuclear spins in the object to flip at a flip angle when B1+ is applied to the object. The flip angle profile is designed to be proportional to a reciprocal of the measured variation in the excitation field B1+. One or more control parameters of the estimated flip angle profile is adjusted, in accordance with the measured variation in B1+, so as to cancel out variation in actual flip angle until a profile of the actual flip angle is achieved that is substantially uniform throughout the ROI.

17 Claims, 2 Drawing Sheets

OTHER PUBLICATIONS

Rieseberg, S. et al. Two-Dimensional Spatially-Selective RF Excitation Pulses in Echo-Planar Imaging. Magnetic Resonance in Medicine, vol. 47 (2002), pp. 1186-1193.

Oelhafen, M. et al. Calibration of Echo-Planar 2D-Selective RF Excitation Pulses. Magnetic Resonance in Medicine, vol. 52 (2004), pp. 1136-1145.

Nayak, K.S. et al. Real-Time Cardiac MRI at 3 Tesla. Magnetic Resonance in Medicine, vol. 51 (2004), pp. 655-660.

Nayak, K. Identification, Modeling and Correction of Image Artifacts. University of Southern California, Los Angeles, CA knayak@usc.edu, ISMRM, 2005.

Saekho, S. et al. Small Tip Angle Three-Dimensional Tailored Radiofrequency Slab-Select Pulse for Reduced $B_1$ Inhomogeneity at 3T. Magnetic Resonance in medicine, vol. 53 (2005), pp. 478-484.

Sung, K. et al. B1+ Non-Uniformity Correction Using 2D RF Pulse Design. In Proc. Intl. Soc. Mag. Reson. Med., vol. 13 (2005), p. 18.

Sung, K. et al. Experiment and Simulation-Based Optimization of Blood-Myocardium CNR in Cardiac SSFP Imaging. Proc. Intl. Magnetic Resonance Medicine, vol. 13 (2005). (Summary only).

* cited by examiner

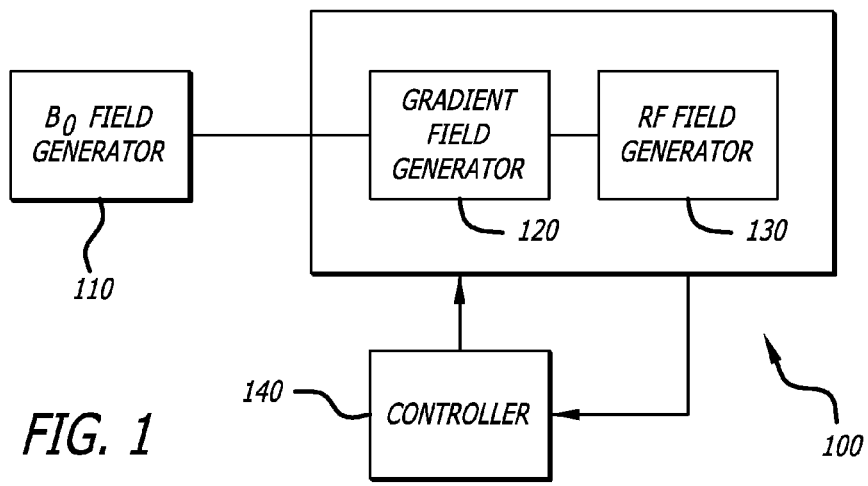
FIG. 1
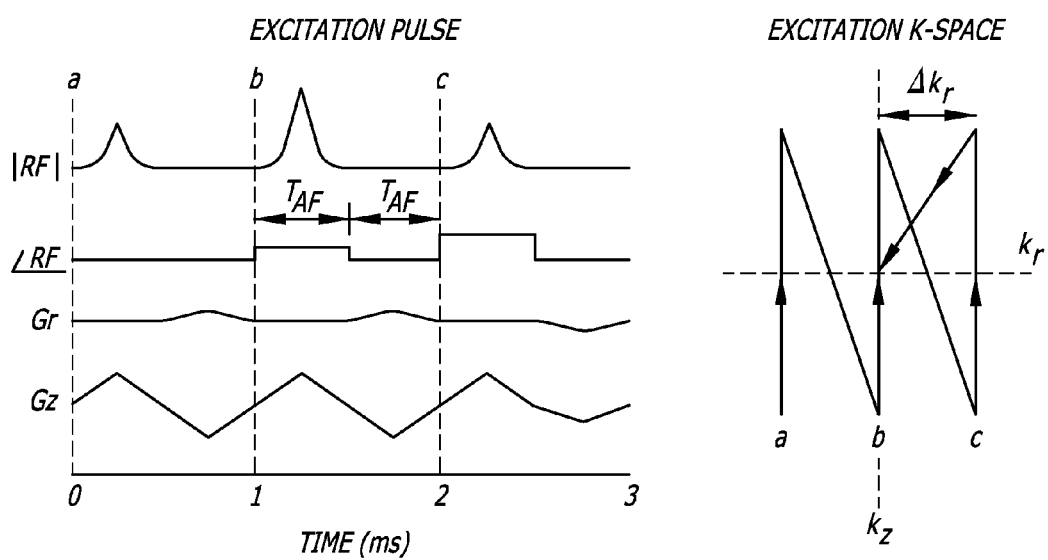
FIG. 2a
FIG. 2b

COMPENSATING FOR NON-UNIFORMITY OF EXCITATION FIELD IN MRI

CROSS-REFERENCE TO RELATED APPLICATIONS

This application claims the benefit of priority under 35 U.S.C. §119(e) from co-pending, commonly owned U.S. provisional patent application, Ser. No. 60/716,745, filed on Sep. 12, 2005, entitled "Method for Magnetic Resonance Excitation Field Non-Uniformity Compensation." The entire content of this provisional application is incorporated herein by reference.

STATEMENT REGARDING FEDERALLY SPONSORED RESEARCH

This work was funded in part by National Institute of Health Grant No. NIH-HL074332. The government may have rights in this application.

BACKGROUND

Clinical MRI (magnetic resonance imaging) is currently experiencing a strong trend towards high field strengths because image signal-to-noise ratio (SNR) can scale up to linearly with field strength. At magnetic fields of about 3 Tesla or more, one problem that must be addressed is non-uniformity of the transmitted RF field (commonly denoted as B1+ or RF+). Non-uniformity in B1+ may cause signal levels and, more importantly, image contrast to vary within an image, making interpretation and quantification difficult.

Uniform treatment of spins is essential during contrast preparation and imaging excitation. Non-uniform B1+ transmission may produce, however, spatially varying flip-angles. This, in turn, may cause intensity and contrast to be non-uniform, and may complicate quantitative imaging.

Accordingly, there is a need for methods and systems that can compensate for non-uniformity of the MRI excitation field B1+ and thereby minimize or reduce variations in intensity and contrast across MRI images.

SUMMARY

A method of compensating for non-uniformity of excitation field B1+ in MRI may include measuring a variation in the excitation field B1+ over a region of interest (ROI) in an object. The B1+ field causes nuclear spins in the object to rotate by a flip angle, when B1+ is applied to the object.

The method may further include designing a flip angle profile f(r) to be proportional to the reciprocal of the measured variation in the excitation field B1+, and adjusting one or more control parameters of the flip angle profile f(r) in accordance with the measured variation in B1+ so as to cancel out the variation in the actual flip angle, until an actual flip angle profile is achieved that is substantially uniform throughout the ROI.

An apparatus for generating RF (radiofrequency) excitation pulses in MRI may include a processing system configured to design a weighting for the RF pulses that produces a profile that is substantially equal to a reciprocal of a measured variation in excitation field B1+ over a region of interest in an object. The processing system may be further configured to adjust one or more control parameters of the weighting profile so as to cancel out an actual variation in the excitation field B1+, so that 2D (two-dimensional) RF pulses are generated that produce a substantially uniform excitation in the ROI of the object when the 2D RF pulses are applied to the object.

BRIEF DESCRIPTION OF THE DRAWINGS

FIG. 1 illustrates a functional block diagram of an MRI apparatus in accordance with one embodiment of the methods and systems described in the present disclosure.

FIG. 2a illustrates a prototype TIP-COMP (Transmit In-Plane COMPensation) excitation pulse, in accordance with one embodiment of the methods and systems described in the present disclosure.

FIG. 2b illustrates the fly-back excitation k-space trajectory associated with the TIP-COMP pulse illustrated in FIG. 2a.

FIGS. 3a-3i illustrate arbitrary ROI selections and linear profile variations, for the TIP-COMP pulse shown in FIG. 2a.

DETAILED DESCRIPTION

Figure 3A:
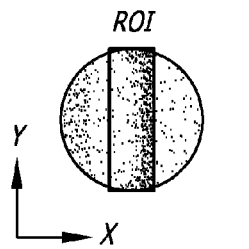

In the present disclosure, a 2D RF pulse design is described that compensates for B1+ non-uniformity in slice selective excitations. B1+ non-uniformity tends to increase with static field strength, and in cardiac imaging, tends to vary primarily along one direction over the heart into the chest. Methods and systems are described for designing slice selective pulses whose flip angle varies along one in-plane direction. In order to achieve uniform excitation over an ROI, this variation is designed to be approximately proportional to the reciprocal of the measured B1+ variation over the ROI.

FIG. 1 illustrates a functional block diagram that provides a schematic overview of an MRI apparatus 100 in accordance with one embodiment of the methods and systems described in the present disclosure. Briefly, the apparatus 100 includes a static field generator 110, a gradient field generator 120, an RF excitation field generator 130, and a controller 140 that controls the operation of the gradient field generator 120 and the RF excitation field generator 130. The controller also analyzes processes the FID (free induction decay) signals received by a receiver (not shown).

The static field generator 110 generates a strong static magnetic field $B_0$, which is used to line up nuclear spins in a target object (whose MRI image is being generated by the apparatus 100) along $B_0$. The gradient field generator 120 generates a gradient field $G(r)$, which is superimposed on the static field $B_0$, so that nuclei in a selected plane can be excited by a proper choice of the frequency spectrum of the transverse RF excitation field. The RF excitation field generator 130 generates an RF excitation field B1+. When B1+ is applied to the object, typically as an RF excitation pulse transverse to $B_0$, the nuclei become excited (due to the RF energy imparted by the RF excitation pulse), so that the nuclear spins rotate by a flip angle. Subsequently, the excited nuclei gradually return to alignment with the static field $B_0$, giving up the excitation energy in the form of weak but detectable FID signals, which are processed by the controller 140 to produce images of the target object.

The controller 140 controls the operation of the MRI apparatus 100, including but not limited to the generation of the fields G(r), and B1+, as well as the processing of the FID signals resulting from the de-excitation (precession and relaxation) of the nuclei in the object. In particular, the controller 140 is configured to design and generate RF excitation pulses that can compensate for variations and non-uniformity in B1+. In one embodiment of the present disclosure, 2D RF excitation pulses are generated that are referred to as "Transmit In-Plane Compensation" (TIP-COMP) pulses.

The controller 140 generates the TIP-COMP pulses (further described and illustrated below) by utilizing 2DRF pulse design techniques to excite a thin slice in one direction, while producing a smooth variation in flip angle in an orthogonal in-plane direction. The flip angle profile variation is designed to be proportional to the reciprocal of the measured B1+ profile over the ROI, and to therefore produce uniform excitation.

B1+ tends to vary smoothly and primarily along one in-plane axis over the heart, in high field cardiac imaging. This may also be true for many other body areas when focusing on primary regions of interest (ROIs) during a patient scan. As long as the weighting function profile is well approximated by a one dimensional function, 2D RF pulses may be used, together with one dimension for B1+ compensation and another dimension for slice selection, to achieve active B1+ correction rapidly and efficiently.

In one embodiment, the controller 140 may design, generate, and analyze the TIP-COMP excitation pulses within a k-space framework, using a small-tip approximation. Ignoring relaxation and off-resonance, the transverse magnetization Mxy of the target object, as a function of the spatial position x, is given by $$M_{xy}(x) = FT(W(k) \cdot S(k)). \tag{1}$$

In other words, the transverse magnetization is the Fourier Transform (FT) of a spatial frequency weighting function, W(k), multiplied by a spatial frequency sampling function, S(k). W(k) is the B1+ field along the trajectory as a function of k instead of t. S(k) is the sampling function with S(k)=1 for values of k that are part of the trajectory and S(k)=0 elsewhere.

The trajectory in k-space may be represented as:

$$k(t) = -\gamma \cdot \int_t^T G(s) ds \tag{2}$$

Hence, in order to obtain a desired excitation profile, the applied RF energy, W(k), along a k-space trajectory determined by the gradient waveform, S(k), should be chosen to be its inverse Fourier Transform.

Practical 2DRF fly-back EPI pulse design involves two stages: the design of subpulses (fast direction) and the design of subpulse weightings (slow direction). The fast direction determines the selectivity of the slice profile while the slow direction design provides the shape of the in-plane flip-angle variation. To reduce B1+ inhomogeneity, the in-plane flip-angle profile may be designed to follow the shape of the reciprocal of B1+ variation. Standard methods for Finite Impulse Response (FIR) filter design may be used to generate the desired in-plane flip-angle profile.

The individual subpulses (fast direction) may be designed using known algorithms. In one embodiment, the Shinnar-LeRoux (SLR) algorithm may be used. Different algorithms may be used in other embodiments of the present disclosure. In one embodiment, the gradient field generator 120 may generate gradient fields have a 40 mT/m amplitude and 150 T/m/s slew rate, and the RF field generator may generate B1+ fields with a peak of 16 µT, thereby reducing overall subpulse duration. A time-bandwidth product (TB) of two may be used for slice selection. In one embodiment of the present disclosure, the variable-rate selective excitation (VERSE) algorithm may be applied to enable and compensate for RF transmission during gradient ramps.

In one embodiment, for the in-plane flip-angle variation (slow direction), the number of subpulses may be set to three, to make the total pulse duration as short as possible, and 1-2-1 binomial coefficients may be used. The spectral response of the 1-2-1 binomial coefficients is the raised cosine which is easy to analyze and control.

FIG. 2*a* illustrates a prototype TIP-COMP excitation pulse, generated in accordance with the method described above. FIG. 2*b* illustrates the fly-back excitation k-space trajectory associated with the TIP-COMP pulse illustrated in FIG. 2*a*.

In the embodiment illustrated in FIG. 2*a*, the prototype TIP-COMP pulses utilize 2DRF fly-back EPI trajectories (in which the RF energy is only transmitted during positive gradient lobes), enabling flexible 1D weighting profiles while keeping the same slice selective excitation. In other embodiments of the present disclosure, RF pulses with a non-flyback (forward and backward) design may be generated, in which the RF power is applied during both positive and negative gradient lobes, thereby shortening pulse duration.

In the embodiment illustrated in FIGS. 2*a*-2*b*, the coordinate system is denoted as the r-z frame, and the components of the corresponding k-space are denoted as $k_r$ and $k_z$, where the r-direction is the logical in-plane axis of variation. The RF subpulse duration is 0.5 ms, while the overall pulse duration including refocusing gradient lobe is 3 ms, which is sufficiently fast for cardiac imaging. This excitation pulse sequence produces a 5 mm slice thickness.

Provided a primary in-plane axis and a 1D desired profile, f(r), along the primary in-plane axis from the measured B1+ map, the controller 140 may compute TIP-COMP control parameters to design an estimate of f(r). Any primary in-plane axis, given from the B1+ map, may be formed by the combination of the logical x and y gradients. In the embodiment illustrated in FIGS. 2*a*-2*b*, in which the number of subpulses is confined to three and 1-2-1 weighting is used in the slow direction, the in-plane flip-angle profile, f̂(r), has a raised cosine shape and may be expressed as follows:

$$\hat{f}(r) = \frac{\alpha}{2}(1 + \cos(\Delta k_r \cdot r + \theta)). \tag{3}$$

In the above equation, α represents the prescribed flip-angle in the MRI apparatus 100, and r represents the spatial position along the primary in-plane axis. $\Delta k_r$ determines the period of f̂(r), while θ determines the amount of shift. In other words, the different values of $\Delta k_r$ create corresponding periods of f̂(r), while the phase increment θ for each RF subpulse provides the shift of f̂(r). In the illustrated embodiment, the proper control parameters, $\Delta k_r$ and θ, may be calculated by the least squares method, minimizing the squared error between f(r) and f̂(r). Different methods for computing the control parameters may be used in different embodiments of the present disclosure.

Figure 3B:
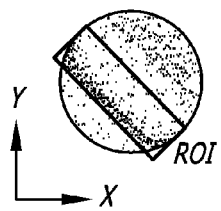
Figure 3C:
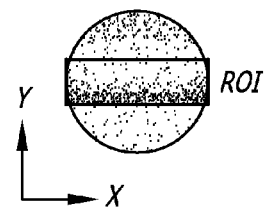

The TIP-COMP prototype design can be adapted on the fly to different ROIs, and B1+ variations, by simply adjusting a few parameters: the ROI selection parameters ($G_r$ direction and θ phase), and the profile variation parameter ($G_r$ amplitude). FIGS. 3*a*-3*i* illustrate arbitrary ROI selections and linear profile variations, for the TIP-COMP pulse shown in FIG. 2a. The selection of the radial direction and location of the center of the ROI are important to correct B1+ non-uniformity over an arbitrary ROI. The different radial directions of the profile variation can be achieved by adjusting physical x and y gradients (FIG. 3a-3c). Specifically, the different radial directions of the profile variation with changing physical x and y gradients are shown with a x direction profile variation (FIG. 3a), with a rotation by 135° (FIG. 3b), and with a y direction profile variation (FIG. 3c).

Figure 3D:
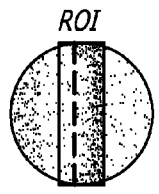
Figure 3E:
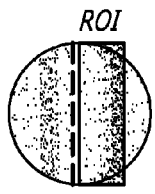
Figure 3F:
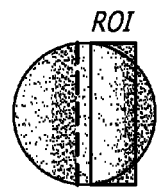

TIP-COMP can be applied to different ROI locations by changing θ, the phase for each RF sub-pulse, as shown in FIG. 3d-3f. Specifically, the different locations of the ROI with changing θ are shown in FIG. 3d with θ=−π/2, in FIG. 3e with θ=π/8, and in FIG. 3f with θ=π/2.

Figure 3G:
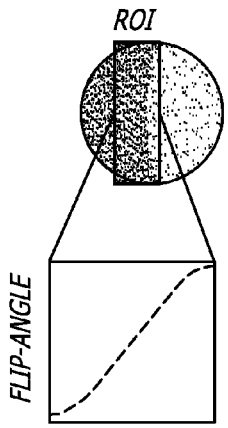
Figure 3H:
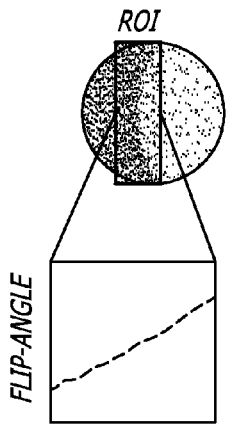
Figure 3I:
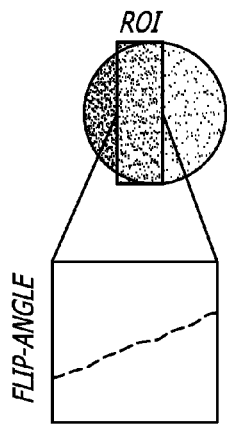

Approximately linear profile variations created by changing the period of raised cosine, controlled by $\Delta k_r$, are shown in FIGS. 3g-3i. Specifically, the different in-plane profile variations (top) and the flip angle cross-section plots within the ROI (bottom) are shown in FIGS. 3g-3i, with $\Delta k_r$ halved from g to h, and again from h to i. To have a proper variation profile, the calculation of $\Delta k_r$ is based on a fitting to the reciprocal of the previously measured B1+ distribution.

Figure 4:
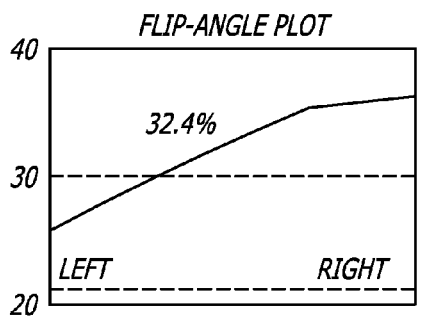
FIG. 4 illustrate B1+ inhomogeneity correction in a human head, at magnetic fields of 3 Tesla, by comparing the cross-section flip-angle plots over a ROI, obtained by TIP-COMP pulses, as compared to the same quantities obtained by conventional pulses.
Figure 4:
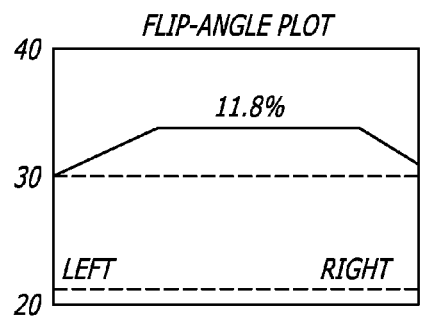

FIG. 4 illustrates B1+ inhomogeneity correction in a human head, at magnetic fields of 3 Tesla, by comparing the cross-section flip-angle plots over a ROI, obtained by TIP-COMP pulses, as compared to the same quantities obtained by conventional pulses. Cross-section flip-angle plots along the primary in-plane axis, 45°, are shown, clockwise from the vertical axis. It can be seen from FIG. 4 that a 32.4% flip-angle variation was reduced to 11.8%, using the TIP-COMP pulses described above. The percentage variation within the ROI was reduced from 43.6% to 24.3%, and the SD/mean was reduced from 14.1% to 5.7% using the TIP-COMP pulses.

In sum, an RF pulse design has been described that can reduce the flip-angle variation by correcting approximately unidirectional B1+ variation. The TIP-COMP RF pulse design, described in the present disclosure, can be dynamically adapted to different ROIs and B1+ variations by simply adjusting two parameters (θ and $\Delta k_r$). TIP-COMP pulses may reduce the SD/mean flip-angle from about 14.1% to about 5.7% in head imaging, and from about 22.4% to about 8.5% over the LV in cardiac imaging at 3 T. This reduction of the B1+ variation is particularly important for high field imaging and quantitative imaging.

While certain embodiments have been described of systems and methods for compensating for non-uniformity in the MRI excitation field, it is to be understood that the concepts implicit in these embodiments may be used in other embodiments as well. The protection of this application is limited solely to the claims that now follow.

In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of compensating for non-uniformity of excitation field B1+ in magnetic resonance imaging (MRI), the method comprising:
    measuring a variation in the excitation field B1+ over a region of interest (ROI) in an object, wherein the B1+ field causes nuclear spins in the object to rotate by a flip angle when B1+ is applied to the object;
    designing a flip angle profile f̂(r) to be proportional to a reciprocal of the measured variation in the excitation field B1; and
    adjusting one or more control parameters of the flip angle profile f̂(r) in accordance with the measured variation in B1+, so as to cancel out variation in actual flip angle until a profile of the actual flip angle is achieved that is substantially uniform throughout the ROI.

2. The method of claim 1, wherein the act of designing the flip angle profile f̂(r) comprises using 1-2-1 binomial weighting coefficients, and
    wherein a mathematical formula for f̂(r) comprises:

$$\hat{f}(r) = \frac{\alpha}{2}(1 + \cos(\Delta k_r \cdot r + \theta)),$$

where α is a prescribed flip-angle, and r is a position vector along a primary in-plane axis.

3. The method of claim 2,
    wherein the one or more control parameters comprise $\Delta k_r$ and θ;
    wherein $\Delta k_r$ is a control parameter that determines a period of f̂(r); and
    wherein θ is a control parameter that determines an amount of shift of f̂(r).

4. The method of claim 1,
    wherein a mathematical formula for transverse magnetization $M_{xy}$ of the object as a function of the spatial position comprises a Fourier Transform (FT) of a spatial frequency weighting function, W(k), multiplied by a spatial frequency sampling function, S(k):

$$M_{xy}(x) = FT(W(k) \cdot S(k)).$$

5. The method of claim 4,
    wherein a trajectory of RF energy in k-space is represented by a spatial frequency variable k(t) given by:

$$k(t) = -\gamma \cdot \int_t^T G(s) ds,$$

and wherein the weighting function W(k) is the B1+ field along the trajectory k(t) as a function of k.

6. The method of claim 1, wherein 2D RF excitation pulses that produce the substantially uniform actual flip angle profile has a duration of about 3 ms each.

7. The method of claim 6, wherein the 2D RF excitation pulses are adapted for single-slice excitation in one direction.

8. The method of claim 7,
    wherein each of the 2D RF excitation pulses comprises about three sub-pulses.

9. A method of generating 2D RF excitation pulses for magnetic resonance imaging of an object, the method comprising:
    applying a static magnetic field $B_0$ to the object;
    applying a time-varying and spatially varying gradient field G(x, y, z, t), parallel to $B_0$, to the object;
    applying an excitation field B1+ to the object, wherein the field B1+ causes nuclear spins in the object to flip at a flip angle when the field B1+ is applied to the object;

measuring a variation in the excitation field B1+ over a region of interest (ROI) in the object;

designing a flip angle profile f̂(r) to be proportional to a reciprocal of the measured variation in B1;

adjusting one or more control parameters of the designed flip angle profile f̂(r), in accordance with the measured variation in B1+, so as to cancel out the variation in B1+ until an actual flip angle profile is achieved that is substantially uniform throughout the ROI, thereby generating 2D RF excitation pulses that result in a substantially uniform excitation profile throughout the ROI.

10. The method of claim 9, further comprising designing the 2D RF excitation pulses to follow a fly-back trajectory in excitation k-space.

11. The method of claim 9, wherein a mathematical formula for the estimate f̂(r) of the flip-angle profile comprises:

$$\hat{f}(r) = \frac{\alpha}{2}(1 + \cos(\Delta k_r \cdot r + \theta));$$

wherein $\alpha$ is a prescribed flip-angle, and r is a position vector along the primary in-plane axis;

wherein the one or more control parameters comprise $\Delta k_r$ and $\theta$, where $\Delta k_r$ is a control parameter that determines the period of f̂(r), and where $\theta$ is a control parameter that determines the amount of shift of f̂(r).

12. An MRI system for generating MRI images of an object, the MRI system comprising:

a static field generator configured to generate a static magnetic field $B_0$;

a gradient field generator configured to generate a time-varying and spatially varying gradient field G(r), parallel to $B_0$; and an RF excitation pulse generator configured to generate an RF excitation field B1+ and apply the field B1+ to the object so that nuclear spins in the object flip at a flip angle, the RF pulse generator further configured to measure a variation in B1+ over a region of interest (ROI) in the object, and to design a weighting profile for 2D RF pulses that is proportional to a reciprocal of the measured variation in the B1+, thereby generating 2D RF excitation pulses that produce a substantially uniform excitation in the object by adjusting one or more control parameters in the weighting profile until variation in actual profile of B1+ is substantially canceled out.

13. The apparatus of claim 12, wherein a mathematical formula for transverse magnetization $M_{xy}$ of the object as a function of the spatial position comprises a Fourier Transform (FT) of a spatial frequency weighting function, W(k), multiplied by a spatial frequency sampling function, S(k):

$$M_{xy}(x) = FT(W(k) \cdot S(k)).$$

14. The apparatus of claim 13, wherein a trajectory of RF energy in k-space is represented by a spatial frequency variable k(t) given by:

$$k(t) = -\gamma \cdot \int_t^T G(s)ds,$$

where G represents the gradient field, and wherein the weighting function W(k) is the B1+ field along the trajectory k(t) as a function of k.

15. The apparatus of claim 12, wherein each of the 2D RF excitation pulses has a duration of about 3 ms each.

16. The apparatus of claim 12, wherein the 2D RF excitation pulses are adapted for single-slice excitation in a single direction.

17. An apparatus for generating RF excitation pulses in MRI (magnetic resonance imaging), the apparatus comprising a processing system configured to design a weighting profile for the RF pulses that is proportional to a reciprocal of a measured variation in excitation field B1+ over a region of interest in an object, the processing system further configured to adjust one or more control parameters of the weighting profile so as to cancel out an actual variation in the excitation field B1+, so that 2D RF pulses are generated that produce a substantially uniform excitation in the ROI of the object when the 2D RF pulses are applied thereto.

* * * * *

UNITED STATES PATENT AND TRADEMARK OFFICE
CERTIFICATE OF CORRECTION

PATENT NO.       : 7,372,270 B2                                   Page 1 of 1
APPLICATION NO.  : 11/531090
DATED            : May 13, 2008
INVENTOR(S)      : KyungHyun Sung and Krishna Nayak It is certified that error appears in the above-identified patent and that said Letters Patent is hereby corrected as shown below:

Column 1, line 15, should be amended as follows:

This "work was funded in part by National Institute of Health Grant" -- invention was made with government support under Contract -- No. NIH-HL074332 -- awarded by the -- National Institutes of Health and Contract No. AHA-0435249N awarded by the American Heart Association --. The government "may have" -- has -- certain rights in the invention.

Signed and Sealed this

Thirtieth Day of June, 2009

JOHN DOLL
*Acting Director of the United States Patent and Trademark Office*